United States Patent
Shen

(10) Patent No.: US 9,620,527 B2
(45) Date of Patent: Apr. 11, 2017

(54) DISPLAY DEVICE HAVING DATA LINE CONNECTED TO CONDUCTIVE PAD THROUGH FIRST VIA AND ITS MANUFACTURING METHOD

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventor: Qiyu Shen, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/769,577

(22) PCT Filed: Apr. 17, 2015

(86) PCT No.: PCT/CN2015/076842
§ 371 (c)(1),
(2) Date: Aug. 21, 2015

(87) PCT Pub. No.: WO2016/050052
PCT Pub. Date: Apr. 7, 2016

(65) Prior Publication Data
US 2016/0254283 A1 Sep. 1, 2016

(30) Foreign Application Priority Data
Sep. 30, 2014 (CN) .......................... 2014 1 0525371

(51) Int. Cl.
*H01L 27/12* (2006.01)
*H01L 21/77* (2017.01)
(Continued)

(52) U.S. Cl.
CPC ........ *H01L 27/1237* (2013.01); *G02F 1/1362* (2013.01); *G02F 1/1368* (2013.01);
(Continued)

(58) Field of Classification Search
CPC ............. H01L 27/1251; H01L 27/1237; H01L 27/124; H01L 27/1262; G02F 1/1368; G02F 1/136286
See application file for complete search history.

(56) References Cited

U.S. PATENT DOCUMENTS

2009/0302325 A1* 12/2009 Huh ........................ H01L 27/12
257/72
2012/0007091 A1* 1/2012 Lee .................... G02F 1/136286
257/60
(Continued)

FOREIGN PATENT DOCUMENTS

CN 102683367 A 9/2012
CN 103531640 A 1/2014
(Continued)

OTHER PUBLICATIONS

International Search Report mailed Jun. 30, 2015; PCT/CN2015/076842.
(Continued)

*Primary Examiner* — Michael Jung
(74) *Attorney, Agent, or Firm* — Ladas & Parry LLP

(57) ABSTRACT

An array substrate includes a base substrate (10) and a gate line (11) and a data line (12) provided on the base, the gate line (11) and the data line (12) define a pixel unit, and in the pixel unit, a thin film transistor (13) is provided, the thin film transistor (13) includes a gate electrode (131), a gate insulation layer (132), an active layer (133), a source electrode (134) and a drain electrode (135). The gate insulation layer (132) includes a first gate insulation portion (1321) and a
(Continued)

second gate insulation portion (1322), the gate electrode (131) is located between the first gate insulation portion (1321) and the second gate insulation portion (1322), and the second gate insulation portion (1322) is located between the gate electrode (131) and the active layer (133). The array substrate further includes a conductive pad (114), and a first via (15) corresponding to the conductive pad (114) is provided in the gate insulation layer (132) at both sides of the gate line (11), and the data line (12) is connected to the conductive pad (114) through the first via (15). The array substrate is capable of improving the definition, the resolution and the aperture ratio of a display device. A manufacturing method for an array substrate and a display device including such an array substrate are also disclosed.

20 Claims, 4 Drawing Sheets

(51) Int. Cl.
*H01L 29/786* (2006.01)
*G02F 1/1362* (2006.01)
*G02F 1/1368* (2006.01)

(52) U.S. Cl.
CPC ........ *G02F 1/136286* (2013.01); *H01L 21/77* (2013.01); *H01L 27/12* (2013.01); *H01L 27/124* (2013.01); *H01L 27/1251* (2013.01); *H01L 27/1262* (2013.01); *H01L 29/786* (2013.01)

(56) References Cited

U.S. PATENT DOCUMENTS

| | | | | |
|---|---|---|---|---|
| 2012/0187404 | A1* | 7/2012 | Seong | H01L 27/124 257/59 |
| 2015/0028300 | A1* | 1/2015 | Kim | H01L 29/7869 257/40 |
| 2015/0198845 | A1* | 7/2015 | Lee | G02F 1/133528 349/46 |
| 2016/0064423 | A1* | 3/2016 | Furukawa | H01L 27/1244 257/66 |
| 2016/0093743 | A1* | 3/2016 | Kim | H01L 29/7869 257/43 |
| 2016/0190164 | A1* | 6/2016 | Park | H01L 27/124 257/72 |

FOREIGN PATENT DOCUMENTS

| | | |
|---|---|---|
| CN | 104392999 A | 3/2015 |
| KR | 1020070075316 A | 7/2007 |
| KR | 1020120085923 A | 8/2012 |
| KR | 1020140091808 A | 7/2014 |

OTHER PUBLICATIONS

Written Opinion of the International Searching Authority mailed Jun. 30, 2015; PCT/CN2015/076842.

Korean Office Action dated Jan. 31, 2017; Appln. No. KR10-2015-7023158.

\* cited by examiner

DISPLAY DEVICE HAVING DATA LINE CONNECTED TO CONDUCTIVE PAD THROUGH FIRST VIA AND ITS MANUFACTURING METHOD

TECHNICAL FIELD

The embodiments of the present invention relate to an array substrate and its manufacturing method, and a display device.

BACKGROUND

A thin film transistor liquid crystal display device is a flat super slim display device, and has characters such as small volume, low power consumption, no radiation, and so on, and therefore is used widely.

The thin film transistor liquid crystal display device includes an array substrate, and the array substrate includes a base substrate and structures such as crisscrossed gate lines and data lines, thin film transistors, pixel electrodes, and son on provided on the base substrate. The transistors each include a gate electrode, a gate insulation layer, an active layer, a source electrode, and a drain electrode, wherein the gate insulation layer is provided between the gate electrode and the active layer, and the gate insulation layer may include a first gate insulation portion and a second gate insulation portion, so that parasitic capacitance formed between the gate lines and the data lines at the intersection positions between the gate lines and the data lines is low and thus the power consumption of the thin film transistor liquid crystal display device is low.

SUMMARY

At least one embodiment of the present invention provides an array substrate and its manufacturing method, and a display device, with the array substrate, the on-state current of the thin film transistor can be improved without increasing the parasitic capacitance, and thus it is facilitate to improve definition, resolution and aperture ratio of the display device.

At least one embodiment of the present invention provides an array substrate comprising: a base substrate, and a gate line and a data line which are provided on the base substrate to be intersected with each other, wherein the gate line and the data line define a pixel unit, the pixel unit is provided with a thin film transistor therein, the thin film transistor includes a gate electrode, a gate insulation layer, an active layer, a source electrode and a drain electrode, the gate insulation layer includes a first gate insulation portion and a second gate insulation portion, the gate electrode is located between the first gate insulation portion and the second gate insulation portion, the second gate insulation portion is located between the gate electrode and the active layer; the array substrate further includes a conductive pad located at an intersection position of the gate line and the data line; and a first via corresponding to the conductive pad provided in the gate insulation layer at both sides of the gate line, and the data line is connected to the conductive pad through the first via.

For example, along a direction perpendicular to the gate line, the conductive pad has a size larger than that of the gate line.

For example, at the thin film transistor, the first gate insulation portion, the gate electrode, the second gate insulation portion, the active layer, the source electrode and the drain electrode provided at a same layer are subsequently provided on the base substrate in a direction away from the base substrate; at the intersection position between the gate line and the data line, the conductive pad, the first gate insulation portion, the gate line, the second gate insulation portion and the data line are subsequently provided on the base substrate in the direction away from the base substrate.

For example, at the thin film transistor, the source electrode and the drain electrode provided at a same layer, the active layer, the second gate insulation portion, the gate electrode, the first gate insulation portion are subsequently provided on the base substrate in a direction away from the base substrate, and the data line is connected to the source electrode via a second via in the gate insulation layer; at the intersection position between the gate line and the data line, the conductive pad, the second gate insulation portion, the gate line, the first gate insulation portion and the data line are subsequently provided on the base substrate.

For example, the second gate insulation portion has a dielectric constant larger than that of the first gate insulation portion.

For example, the first gate insulation portion has a thickness of 1000 Å~3000 Å, and the second gate insulation portion has a thickness of 1000 Å~3000 Å.

At least one embodiment of the present invention provides a display device including the array substrate according to any embodiments as mentioned above.

At least one embodiment of the present invention provides a manufacturing method for an array substrate comprising: forming a gate line, a gate electrode, a gate insulation layer, an active layer, a data line, a source electrode, a drain electrode and a conductive pad on a base substrate, the gate insulation layer includes a first gate insulation portion and a second gate insulation portion; the gate electrode is located between the first gate insulation portion and the second gate insulation portion, and the second gate insulation portion is located between the gate electrode and the active layer; the conductive pad is located at an intersection position between the gate line and the data line, and a first via corresponding to the conductive pad is formed in the gate insulation layer at both sides of the gate line, and the data line is connected to the conductive pad through the first via.

For example, a pattern including the conductive pad is formed on the base substrate; on the base substrate on which the pattern including the conductive pad has been formed, the first gate insulation portion is formed; on the base substrate on which the first gate insulation portion has been formed, a gate metal layer is formed, and after subjected from patterning process, a pattern including the gate line and the gate electrode is formed; on the base substrate on which the pattern including the gate line and the gate electrode has been formed, a second gate insulation film is formed, and after subjected from patterning process, the second gate insulation portion is formed; on the base substrate on which the second gate insulation portion has been formed, a semiconductor layer is formed, and after subjected from patterning process, a pattern including the active layer is formed; by performing patterning process, the first via corresponding to the conductive pad is formed in the gate insulation layer at both sides of each of the gate line; on the base substrate on which the first via has been formed, a source/drain metal layer is formed, and after subjected from patterning process, a pattern including the data line, the source electrode and the drain electrode is formed, the data line and the gate line are intersected above the conductive pad, and the data line is connected to the conductive pad through the first via.

For example, a source/drain metal layer is formed on the base substrate, and after subjected from patterning process, a pattern including the source electrode, the drain electrode and the conductive pad is formed; on the base substrate on which the pattern including the source electrode, the drain electrode and the conductive pad has been formed, a semiconductor layer is formed, and after subjected from patterning process, a pattern including the active layer is formed; on the base substrate on which the pattern including the active layer has been formed, a second gate insulation film is formed, and after subjected from patterning process, the second gate insulation portion is formed; on the base substrate on which the second gate insulation portion has been formed, a gate metal layer is formed, and after subjected from patterning process, a pattern including the gate line and the gate electrode is formed; on the base substrate on which the pattern including the gate line and the gate electrode has been formed, the first gate insulation portion is formed; after subjected from patterning process, the first via corresponding to the conductive pad and the second via corresponding to the source electrode are formed in the gate insulation layer; on the gate insulation layer in which the first via and the second via have been formed, a data metal layer is formed, and after subjected from patterning process, a pattern including the data line is formed, the data line is connected with the conductive pad through the first via, and connected to the source electrode through the second via.

For example, the first gate insulation portion and the second gate insulation film are formed by deposition, and processing parameters for depositing the second gate insulation film are different from processing parameter for depositing the first gate insulation portion, so that the second gate insulation portion formed after subjected from patterning processing has a dielectric constant larger than that of the first gate insulation portion.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

Figure 1:
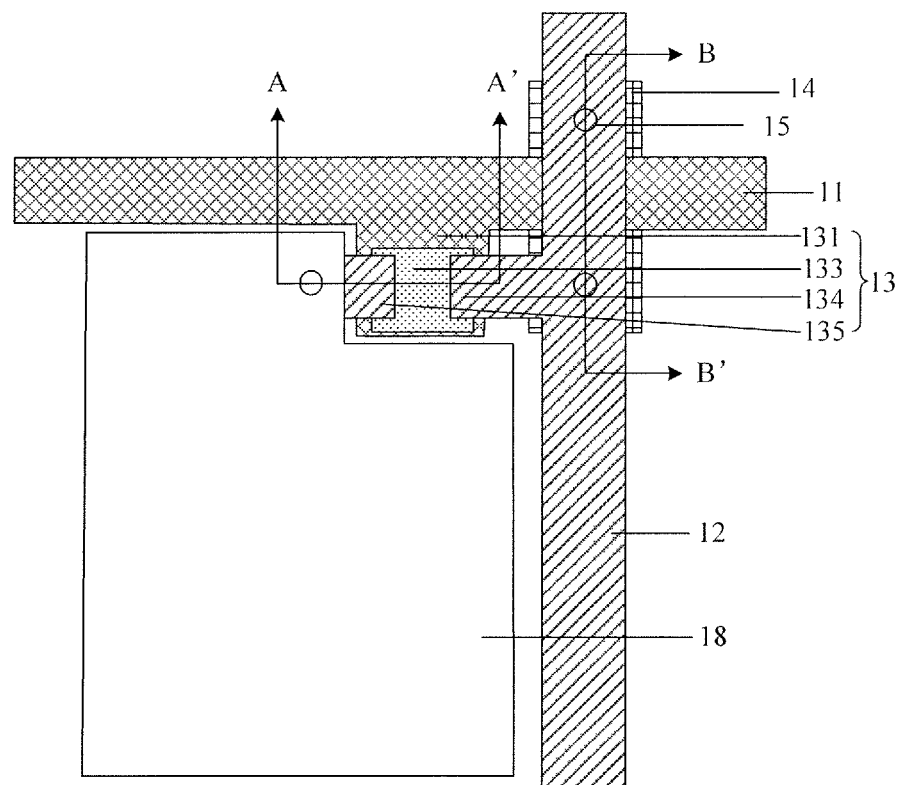
FIG. 1 is schematic plan view showing a portion of a first array substrate according to an embodiment of the present invention.

Description of the Reference Numerals: 10—base substrate; 11—gate line; 12 data line; 13—thin film transistor; 131—gate electrode; 132—gate insulation layer; 1321—first gate insulation portion; 1322—second gate insulation portion; 133—active layer; 134—source electrode; 135—drain electrode; 136—light shielding layer; 137—insulation layer; 14 conductive pad; 15—first via; 16—second via; 17—passivation layer; 18—pixel electrode.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

The present inventor found that since the thickness of the gate insulation layer is larger, the on-state current of the thin film transistor is low. In order that the thin film transistor has relative larger on-state current, generally, the aspect ratio of the channel of the thin film transistor is relative large, and thus the size of the thin film transistor is caused to be large, which is not helpful to improve the definition, the resolution and the aperture ratio of the thin film transistor liquid crystal display device.

At least one embodiment of the present invention provides an array substrate which is capable of improving the on-state current of the thin film transistor without increasing the parasitic capacitance, and thus facilitating to improve the definition, the resolution and the aperture ratio of a display device including the array substrate.

The array substrate includes a base substrate and a gate line and a data line provided in a crisscrossing manner on the base substrate, the gate line and the data line define a pixel unit in which a thin film transistor is provided. The thin film transistor includes a gate electrode, a gate insulation layer, an active layer, a source electrode and a drain electrode. The gate insulation layer includes a first gate insulation portion and a second gate insulation portion, the gate electrode is provided between the first gate insulation portion and the second gate insulation portion, and the second gate insulation portion is located between the gate electrode and the active layer.

The on-state current ID of the thin film transistor is calculated by the formula:

$$I_D = \frac{C_{GI}\mu_n W}{2L}(V_G - V_{TH})^2,$$

wherein $C_{GI}$ is capacitance value per unit area of the gate insulation layer between the gate electrode and the active layer, $C_{GI}$ is directly proportional to the dielectric constant of the insulation layer and inversely proportional to the thickness of the insulation layer, $\mu_n$ is carrier mobility, W is the width of the channel of the thin film transistor, L is the length of the channel of the thin film transistor 13, $V_G$ is a gate voltage of the thin film transistor, and $V_{TH}$ is a threshold voltage of the thin film transistor.

Figure 2:
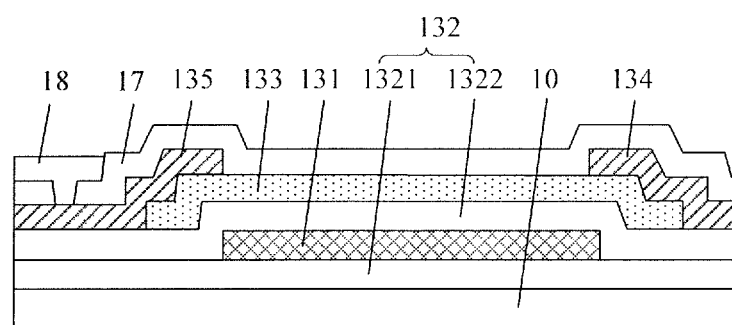
FIG. 2 is a schematic cross-sectional view of the array substrate in FIG. 1 taken in a A-A' direction according to an embodiment of the present invention.

By way of example, as illustrated in FIG. 1, when the thin film transistor 13 on the array substrate is a bottom gate type thin film transistor, as illustrated in FIG. 2, at the position where the thin film transistor 13 is located, the first gate insulation portion 1321, the gate electrode 131, the second gate insulation portion 1322, the active layer 133, the source electrode 134 and the drain electrode 135 provided at the same layer are subsequently provided on the base substrate 10 in a direction away from the base substrate 10, a pixel electrode 18 is connected to the drain electrode of the transistor 10 through a via penetrating through a passivation layer 17. At this time, only the second gate insulation portion 1322 is provided between the gate electrode 131 and the active layer 133, while the insulation layer provided between the gate electrode and the active layer in the prior art is the gate insulation layer including the first gate insulation portion and the second gate insulation layer, therefore, the $C_{GI}$ of the thin film transistor 13 on the array substrate according to the embodiment of the present invention is relative larger, and thus the on-state current of the thin film transistor is larger, and hence the thin film transistor 13 in the embodiment of the present invention has a low aspect ratio. Since the thin film transistor 13 has a small size, the requirement on the on-state current by the display device can be satisfied, and it facilitates to improve the definition, the resolution and the aperture ratio of the display device.

Figure 3:
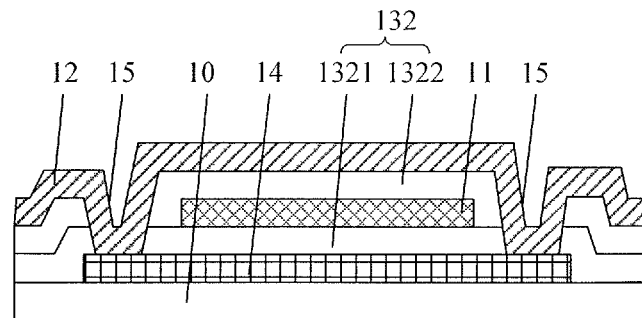
FIG. 3 is a schematic cross-sectional view of the array substrate in FIG. 1 taken in a B-B' direction according to an embodiment of the present invention.

As illustrated in FIG. 3, the array substrate further includes a conductive pad located at the intersection position between the gate line 11 and the data line 12, a first via 15 corresponding to the conductive pad 14 are provided on the gate insulation layer 132 at both sides of the gate line 11, and the data line 12 are connected with the conductive pad through the first via 15. Along the direction perpendicular to the gate line 11, the size of the conductive pad 14 is larger than that of the gate line, and as illustrated in the cross-sectional view in FIG. 3, the width of the conductive pad 14 is larger than that of the gate line 11.

By way of example, as illustrated in FIG. 1, the thin film transistor 13 on the array substrate is a bottom gate type thin film transistor, as illustrated in FIG. 3, at the intersection position between the gate line 11 and the data line 12, the conductive pad 14, the first gate insulation portion 1321, the gate line 11, the second gate insulation portion 1322 and the data line 12 are subsequently disposed on the base substrate 10 in a direction away from the base substrate 10. At this time, the parasitic capacitor on the array substrate is a first capacitor C1 formed by the conductive pad 14, the first gate insulation portion 1321, and the gate line 11 and a second capacitor C2 formed by the gate line 11, the second gate insulation portion 1322 and the data line 12, the first capacitor C1 and the second capacitor C2 are connected in serial to form a capacitor C, wherein, $$C1 = \frac{\xi 0 \cdot \xi 1 \cdot S}{d1},$$

$$C2 = \frac{\xi 0 \cdot \xi 2 \cdot S}{d2},$$

$\xi 0$ is the vacuum absolute dielectric constant, $\xi 1$ is the dielectric constant of the first gate insulation portion 1321, $\xi 2$ is the dielectric constant of the second gate insulation portion 1322, d1 is the thickness of the first gate insulation portion 1321, d2 is the thickness of the second gate insulation portion 1322. According to the principle of the capacitors connected in parallel, it can be known that:

$$C = \frac{C1 \cdot C2}{C1 + C2} = \frac{\xi 0 \cdot \xi 1 \cdot \xi 2 \cdot S}{d2 \cdot \xi 1 + d1 \cdot \xi 2}.$$

Compared with the situation that the parasitic capacitor on the array substrate is a capacitor C' formed by the gate line, the gate insulation layer (the gate insulation layer including the first gate insulation portion and the second gate insulation portion), and the data line, wherein, $$C' = \frac{\xi 0 \cdot \xi' \cdot S}{d1' + d2'},$$

wherein, d1' is the thickness of the first gate insulation portion, d2' is the thickness of the second gate insulation portion, $\xi 0$ is the vacuum absolute dielectric constant, $\xi'$ is the dielectric constant of the gate insulation layer, and $$\xi' = \frac{(d1' + d2') \cdot \xi 1' \cdot \xi 2'}{d2' \cdot \xi 1' + d1' \cdot \xi 2'},$$

$\xi 1'$ is the dielectric constant of the first gate insulation portion, $\xi 2'$ is the dielectric constant of the second gate insulation portion. If the material and the thickness of the first gate insulation portion 1321 and the second gate insulation portion 1322 in the embodiment of the present invention are respectively the same as the material and the thickness of the first gate insulation portion and the second gate insulation portion in the prior art, d1=d1', d2=d2', $\xi 1 = \xi 1'$, $\xi 2 = \xi 2'$, then C=C'.

From above, it can be seen that the value of the parasitic capacitor on the array substrate in the embodiment of the present invention is the same as that of the parasitic capacitor in the prior art, therefore, upon the array substrate in an embodiment of the present invention being used in a display device, the power consumption of the display device will not increase, while the on-state current of the thin film transistor 13 is improved.

Figure 4:
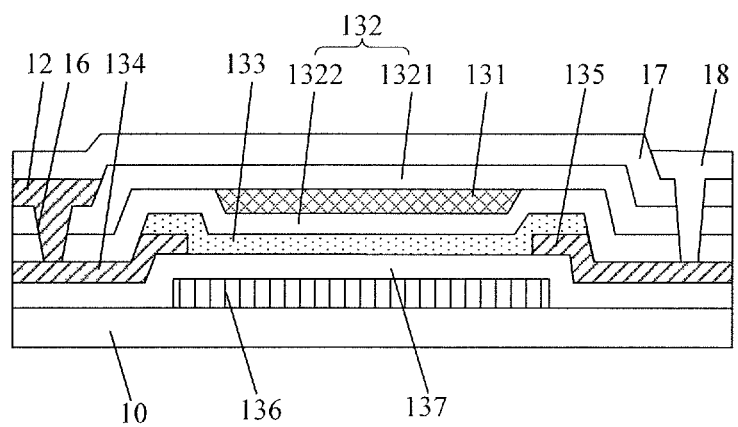
FIG. 4 is a schematic cross-sectional view at a thin film transistor of a second array substrate according to another embodiment of the present invention.
Figure 5:
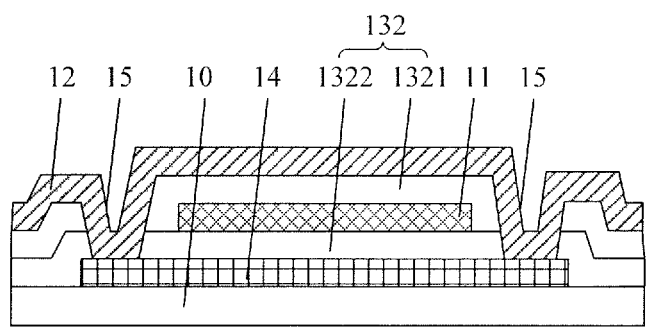
FIG. 5 is a schematic cross-sectional view at the intersection position between the data line and the gate line in the second array substrate according to another embodiment of the present invention.

It is to be noted that the thin film transistor on the array substrate may also be a top gate type thin film transistor, and in this case, as illustrated in FIG. 4, at the position of the thin film transistor, the source electrode 134 and the drain electrode 135 provided at the same layer, the active layer 133, the second gate insulation portion 1322, the gate electrode 131, and the first gate insulation portion 1321 are subsequently provided on the base substrate 10 in a direction away from the substrate 10, the data line 12 is connected with the source electrode 134 through the second via 16 in the gate insulation layer 132, and the pixel electrode 18 is connected with the drain electrode 135 of the thin film transistor through a via penetrating through the passivation layer 17, the first gate insulation portion 1321 and the second gate insulation layer 1322. At this time, in order to prevent the light from a backlight source from influencing the thin film transistor, a light shielding layer 136 and an insulation layer 137 may be further provided between the base substrate 10 and the active layer 133. As illustrated in FIG. 5, at the intersection portion between the gate line 11 and the data line 12, the conductive pad 14, the second gate insulation portion 1322, the gate line 11, the first gate insulation portion 1321 and the data line 12 are subsequently provided on the base substrate 10 in a direction away from the base substrate 10.

Furthermore, from the above calculation formula for the on-state current ID of the thin film transistor, the more the dielectric constant of the second gate insulation portion, the higher the on-state current of the thin film transistor 13. In at least one embodiment of the present invention, for example, the dielectric constant of the second gate insulation portion 1322 is larger than the dielectric constant of the first gate insulation portion 1321, thus it is possible to enable the on-state current ID of the thin film transistor to be high without increasing the parasitic capacitance of the array substrate. By way of example, the material for the first gate insulation portion 1321 and the second gate insulation portion 1322 is SiNx or $SiO_2$, when the material for the first gate insulation portion 1321 and the second gate insulation portion 1322 is the same, by controlling the processing parameters during manufacturing the gate insulation layer 132, the density of the second gate insulation portion 1322 can be made to be larger that of the first gate insulation portion 1321, and thus the dielectric constant of the second gate insulation portion 1322 is larger than the dielectric constant of the first gate insulation portion 1321. By way of example, when the first gate insulation portion 1321 and the second gate insulation portion 1322 are formed by employing plasma enhanced chemical vapor deposition method, the above processing parameters may be deposition temperature, input power, gas pressure, and so on.

Furthermore, the thickness of the first gate insulation portion 1321 is 1000 Å~3000 Å, and the thickness of the second gate insulation portion 1322 is 1000 Å~3000 Å. It is to be noted that the thickness of the first gate insulation portion 1321 and the thickness of the second gate insulation portion 1322 may be the same or different.

The array substrate as described in the above embodiments can be used in a display device whose display mode is TN mode, ADS mode, IPS mode, VA mode or FFS mode. When the array substrate is used in a display device whose display mode is ADS mode, IPS mode or FFS mode, the array substrate further includes a common electrode.

At least one embodiment of the present invention provides an array substrate, an gate insulation layer of which includes a first gate insulation portion and a second gate insulation portion, wherein, a gate electrode is located between the first gate insulation portion and the second gate insulation portion, and the second gate insulation portion is located between the gate electrode and an active layer, by which the on-state current of the thin film transistor can be effectively improved. In addition, the array substrate further includes a conductive pad at the intersection position between the gate line and the data line, a first via corresponding to the conductive pad are provided on the gate insulation layer at both sides of the gate line, and the data line is connected to the conductive pad through the first via. The array substrate having such a structure has the same parasitic capacitance as that in the prior art, and thus, the array substrate according to at least one embodiment of the present invention can improve the on-state current of the thin film transistor without increasing the parasitic capacitance, and therefore, it facilitates to improve the definition, the resolution and the aperture ratio of the display device.

At least one embodiment of the present invention further provides a display device including the array substrate as described in any of the above embodiments. The display device can be a liquid crystal panel, an electronic paper, an organic light emitting display panel, a mobile phone, a tablet computer, a television, a display, a laptop computer, a digital photo frame, a navigator, and any other component or product having display function. By way of example, when the display device is a liquid crystal device, the display mode of the display device can be TN mode, ADS mode, IPS mode, FFS mode, VA mode, or the like.

At least one embodiment of the present invention provides a manufacturing method for an array substrate, by this method, it is possible to improve the on-state current of the thin film transistor while keeping the parasitic capacitance of the array substrate to be low, thus facilitate to improve the definition, the resolution and the aperture ratio of the display device. The manufacturing method for an array substrate is used to manufacture the array substrate as described in the first embodiment.

The manufacturing method for the array substrate includes forming a gate line 11, a gate electrode 131, a gate insulation layer 132, an active layer 133, a data line 134, a drain electrode 135 and a conductive pad 14 on a base substrate 10, wherein the gate electrode 131, the gate insulation layer 132, the active layer 133, the source electrode 134 and the drain electrode 135 form a thin film transistor 13.

Forming the gate insulation layer 132 includes forming a first gate insulation portion 1321 and a second gate insulation portion 1322.

The gate electrode 131 is located between the first gate insulation portion 1321 and the second gate insulation portion 1322, and the second gate insulation portion 1322 is located between the gate electrode 131 and the active layer 133.

A conductive pad 14 is located at the intersection position between the gate line 11 and the data line 12, and a first via 15 corresponding to the conductive pad 14 is formed in the gate insulation layer 132 at both sides of the gate line 11, and the data line 12 is connected to the conductive pad 14 through the first via 15.

Figure 6:
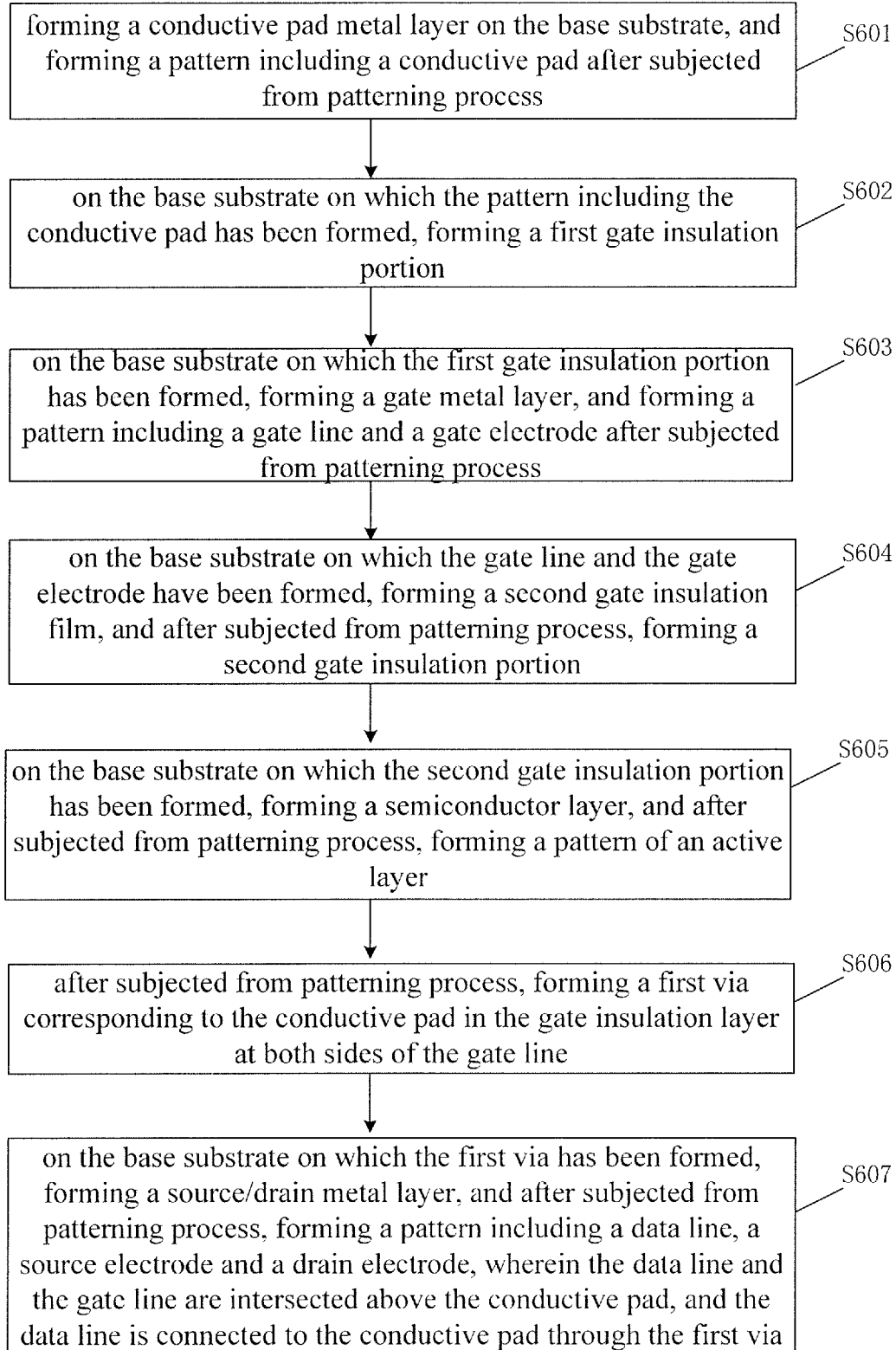
FIG. 6 is a manufacturing flowchart of the first array substrate according to an embodiment of the present invention.

When the thin film transistor is a bottom gate type thin film transistor as illustrated in FIG. 1 to FIG. 3, as illustrated in FIG. 6, forming the gate line 11, the gate electrode 131, the gate insulation layer 132, the active layer 133, the data line 12, the source electrode 134, the drain electrode 135 and the conductive pad 14 on the base substrate 10 includes the steps of:

Step S601, forming a conductive pad metal layer on the base substrate, and forming a pattern including the conductive pad after subjected from patterning process;

A layer of the conductive pad metal layer can be formed on the base substrate 10 by vapor deposition, sputtering, or the like, and a pattern including the conductive pad 14 can be formed by patterning process. The patterning process can include the steps of coating photoresist, exposing, developing, etching and removing the photoresist by using a mask plate having the pattern of the conductive pad 14.

Step S602, on the base substrate on which the pattern including the conductive pad has been formed, forming a first gate insulation portion.

The first gate insulation portion 1321 can be formed on the base substrate on which the pattern including the conductive pad 14 has been formed by using a plasma enhanced chemical vapor deposition method, or the like.

Step S603, on the base substrate on which the first gate insulation portion has been formed, forming a gate metal layer, and forming a pattern including the gate line and the gate electrode after subjected from patterning process.

On the base substrate 10 on which the first gate insulation portion 1321 has been formed, a layer of gate metal layer is formed by vapor deposition, sputtering, or the like method, and after subjected from patterning process, a pattern including the gate line and the gate electrode is formed.

Step S604, on the base substrate on which the gate line and the gate electrode have been formed, forming a second gate insulation film, and after subjected from patterning process, forming the second gate insulation portion.

Step S605, on the base substrate on which the second gate insulation portion has been formed, forming a semiconductor layer, and after subjected from patterning process, forming a pattern of the active layer.

On the base substrate 10 on which the gate insulation layer 132 has been formed, a layer of semiconductor layer is formed by using sputtering method, and so on, and after subjected from patterning process, a pattern including the active layer 133 is formed.

Step S606, after subjected from patterning process, forming a first via corresponding to the conductive pad in the gate insulation layer at both sides of the gate line.

It is to be noted that the pattern including the active 133 may be firstly formed on the gate insulation layer 132, and then the first via 15 is formed; or the first via 15 may be firstly formed in the gate insulation layer 132, and then the pattern including the active layer 133 is formed, and there is no limitation in the embodiments of the present invention.

Step S607, on the base substrate on which the first via has been formed, forming a source/drain metal layer, and after subjected from patterning process, forming a pattern including a data line, a source electrode and a drain electrode, wherein the data line and the gate line are intersected above the conductive pad, and the data line is connected to the conductive pad through the first via.

On the base substrate 10 on which the first via 15 has been formed, a source/drain metal layer is formed by vapor deposition, sputtering, or the like method, and after subjected from patterning process, a pattern including the data line 12, the source electrode 134 and the drain electrode 135 is formed. The data line 12 and the gate line 11 are intersected above the conductive pad 14 and the data line 12 is connected to the conductive pad 14 through the first via 15.

Figure 7:
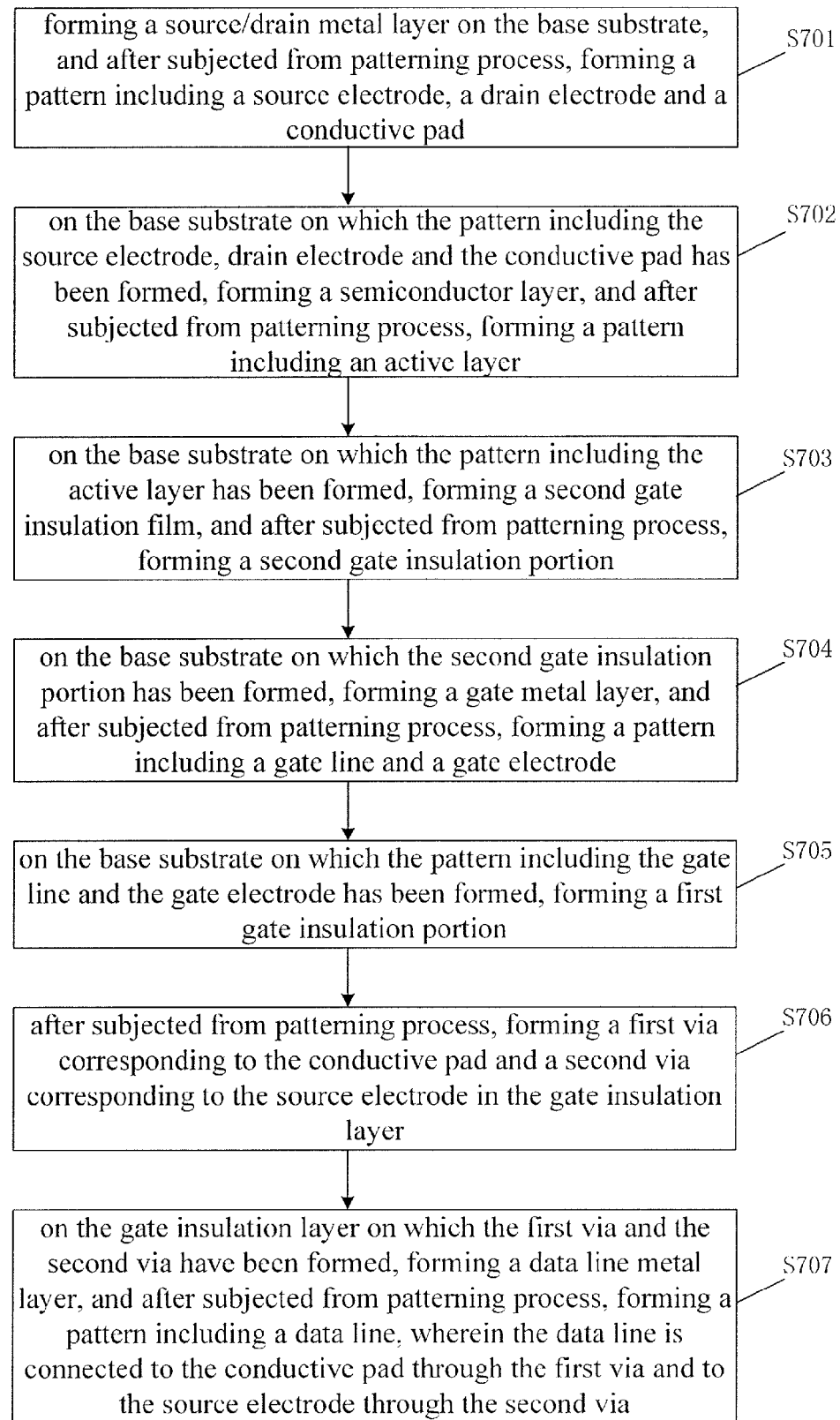
FIG. 7 is a manufacturing flowchart of the second array substrate according to another embodiment of the present invention.

When the thin film transistor is a top gate type thin film transistor as illustrated in FIG. 4 and FIG. 5, as illustrated in FIG. 7, forming the gate line 11, the gate electrode 131, the gate insulation layer 132, the active layer 133, the data line 12, the source electrode 134, the drain electrode 135 and the conductive pad 14 on the base substrate 10 includes the steps of:

Step S701, forming a source/drain metal layer on the base substrate, and after subjected from patterning process, forming a pattern including the source electrode, the drain electrode and the conductive pad;

Step S702, on the base substrate on which the pattern including the source electrode, the drain electrode and the conductive pad has been formed, forming a semiconductor layer, and after subjected from patterning process, forming a pattern including the active layer;

Step S703, on the base substrate on which the pattern including the active layer has been formed, forming a second gate insulation film, and after subjected from patterning process, forming the second gate insulation portion;

Step S704, on the base substrate on which the second gate insulation portion has been formed, forming a gate metal layer, and after subjected from patterning process, forming a pattern including the gate line and the gate electrode;

Step S705, on the base substrate on which the pattern including the gate line and the gate electrode has been formed, forming the first gate insulation portion;

Step S706, after subjected from patterning process, forming the first via corresponding to the conductive pad and the second via corresponding to the source electrode on the gate insulation layer;

Step S707, on the gate insulation layer on which the first via and the second via have been formed, forming a data line metal layer, and after subjected from patterning process, forming a pattern including the data line, wherein the data line is connected with the conductive pad through the first via and with the source electrode through the second via.

In the manufacturing process for the above two kinds of array substrates, the first gate insulation portion 1321 and the second gate insulation film are formed by deposition method, wherein the processing parameters for depositing the second gate insulation film are different from the processing parameters for depositing the first gate insulation portion 1321, so that the density of the second gate insulation portion 1322 formed after subjected from patterning process is larger than that of the first gate insulation portion 1321, and thus the dielectric constant of the so formed second gate insulation portion 1322 is larger than that of the first gate insulation portion 1321. By way of example, when the first gate insulation portion 1321 and the second gate insulation film are formed by plasma enhanced chemical vapor deposition method, the above processing parameters may be deposition temperature, input power, gas pressure, and so on.

For example, the material for the first gate insulation portion 1321 and the second gate insulation portion 1322 is $SiN_x$ or $SiO_2$. The thickness of the first gate insulation portion 1321 is 1000 Å~3000 Å, and the thickness of the second gate insulation portion 1322 is 1000 Å~3000 Å. It is to be noted that the thickness of the first gate insulation portion 1321 and the thickness of the second gate insulation portion 1322 can be the same or different.

In addition, at least one embodiment of the present invention further includes the steps of forming a passivation layer, forming the pixel electrode or the like structure on the base substrate 10 on which the thin film transistor 13 has been formed. For the array substrate applied in the display device whose display mode is IPS mode, ADS mode and FFS mode, the process for manufacturing the array substrate may also include the step of forming a common electrode, and will not be further described in the embodiment of the present invention.

At least one embodiment of the present invention provides a manufacturing method for an array substrate, the manufacturing method for the array substrate includes forming a gate line, a gate electrode, a gate insulation layer, an active layer, a data line, a source electrode, a drain electrode and a conductive pad on a base substrate, wherein the gate insulation layer includes a first gate insulation portion and a second gate insulation portion, the gate electrode is located between the first gate insulation portion and the second gate insulation portion, and the second gate insulation portion is located between the gate electrode and the active layer, thus only the second gate insulation portion is provided between the gate electrode and the active layer of the thin film transistor, and therefore, the on-state current of the thin film transistor can be effectively improved. In addition, a conductive pad is provided at the intersection position between the gate line and the data line, a first via corresponding to the conductive pad is formed on the gate insulation layer at both sides of the gate line, and the data line is connected with the conductive pad through the first via, thus, the value of the parasitic capacitance on the array substrate can be the same as that in the prior art, therefore, the manufacturing method for the array substrate according to at least one embodiment of the present invention can improve the on-state current of the thin film transistor without increasing the parasitic capacitance, and thus facilitate to improve the definition, the resolution and the aperture ratio of the display device.

The foregoing is merely exemplary embodiments of the invention, but is not used to limit the protection scope of the invention. The protection scope of the invention shall be defined by the attached claims.

The present application claims the priority of Chinese Patent Application No. 201410525371.1 filed on Sep. 30, 2014, the Chinese Patent Application is entirely incorporated therein as a part of the present application by reference.

The invention claimed is:

1. An array substrate comprising:
a base substrate, and a gate line and a data line which are provided on the base substrate to be intersected with each other, wherein the gate line and the data line define a pixel unit, the pixel unit is provided with a thin film transistor therein, the thin film transistor includes a gate electrode, a gate insulation layer, an active layer, a source electrode and a drain electrode, the gate insulation layer includes a first gate insulation portion and a second gate insulation portion, the gate electrode is located between the first gate insulation portion and the second gate insulation portion, the second gate insulation portion is located between the gate electrode and the active layer;
a conductive pad located at an intersection position of the gate line and the data line; and
a first via corresponding to the conductive pad provided in the gate insulation layer at both sides of the gate line, wherein the data line is connected to the conductive pad through the first via,
wherein, in a direction perpendicular to base substrate, the gate line and the data line are disposed in different layers and overlapped with each other, the conductive pad and the source electrode are disposed in different layers, and the first gate insulation portion is located between the gate line and the conductive pad.

2. The array substrate according to claim 1, wherein:
along a direction perpendicular to the gate line, the conductive pad has a size larger than that of the gate line.

3. The array substrate according to claim 2, wherein:
at the thin film transistor, the first gate insulation portion, the gate electrode, the second gate insulation portion, the active layer, the source electrode and the drain electrode provided at a same layer are subsequently provided on the base substrate in a direction away from the base substrate; and
at the intersection position between the gate line and the data line, the conductive pad, the first gate insulation portion, the gate line, the second gate insulation portion and the data line are subsequently provided on the base substrate in the direction away from the base substrate.

4. The array substrate according to claim 2, wherein:
at the thin film transistor, the source electrode and the drain electrode provided at a same layer, the active layer, the second gate insulation portion, the gate electrode, the first gate insulation portion are subsequently provided on the base substrate in a direction away from the base substrate, and the data line is connected to the source electrode via a second via in the gate insulation layer; and
at the intersection position between the gate line and the data line, the conductive pad, the second gate insulation portion, the gate line, the first gate insulation portion and the data line are subsequently provided on the base substrate.

5. The array substrate according to claim 2, wherein the second gate insulation portion has a dielectric constant larger than that of the first gate insulation portion.

6. The array substrate according to claim 1, wherein:
at the thin film transistor, the first gate insulation portion, the gate electrode, the second gate insulation portion, the active layer, the source electrode and the drain electrode provided at a same layer are subsequently provided on the base substrate in a direction away from the base substrate; and
at the intersection position between the gate line and the data line, the conductive pad, the first gate insulation portion, the gate line, the second gate insulation portion and the data line are subsequently provided on the base substrate in the direction away from the base substrate.

7. The array substrate according to claim 1, wherein:
at the thin film transistor, the source electrode and the drain electrode provided at a same layer, the active layer, the second gate insulation portion, the gate electrode, the first gate insulation portion are subsequently provided on the base substrate in a direction away from the base substrate, and the data line is connected to the source electrode via a second via in the gate insulation layer; and
at the intersection position between the gate line and the data line, the conductive pad, the second gate insulation portion, the gate line, the first gate insulation portion and the data line are subsequently provided on the base substrate.

8. The array substrate according to claim 1, wherein the second gate insulation portion has a dielectric constant larger than that of the first gate insulation portion.

9. The array substrate according to claim 8, wherein the first gate insulation portion has a thickness of 1000 Å~3000 Å, and the second gate insulation portion has a thickness of 1000 Å~3000 Å.

10. A display device, including an array substrate comprising:
a base substrate, and a gate line and a data line which are provided on the base substrate to be intersected with each other, wherein the gate line and the data line define a pixel unit, the pixel unit is provided with a thin film transistor therein, the thin film transistor includes a gate electrode, a gate insulation layer, an active layer, a source electrode and a drain electrode, the gate insulation layer includes a first gate insulation portion and a second gate insulation portion, the gate electrode is located between the first gate insulation portion and the second gate insulation portion, the second gate insulation portion is located between the gate electrode and the active layer;
a conductive pad located at an intersection position of the gate line and the data line; and
a first via corresponding to the conductive pad provided in the gate insulation layer at both sides of the gate line, wherein the data line is connected to the conductive pad through the first via,
wherein, in a direction perpendicular to base substrate, the gate line and the data line are disposed in different layers and overlapped with each other, the conductive pad and the source electrode are disposed in different layers, and the first gate insulation portion is located between the gate line and the conductive pad.

11. The display device according to claim 10, wherein:
along a direction perpendicular to the gate line, the conductive pad has a size larger than that of the gate line.

12. The display device according to claim 10, wherein:
at the thin film transistor, the first gate insulation portion, the gate electrode, the second gate insulation portion, the active layer, the source electrode and the drain electrode provided at a same layer are subsequently provided on the base substrate in a direction away from the base substrate; and
at the intersection position between the gate line and the data line, the conductive pad, the first gate insulation portion, the gate line, the second gate insulation portion and the data line are subsequently provided on the base substrate in the direction away from the base substrate.

13. The display device according to claim 10, wherein:
at the thin film transistor, the source electrode and the drain electrode provided at a same layer, the active layer, the second gate insulation portion, the gate electrode, the first gate insulation portion are subsequently provided on the base substrate in a direction away from the base substrate, and the data line is connected to the source electrode via a second via in the gate insulation layer; and
at the intersection position between the gate line and the data line, the conductive pad, the second gate insulation portion, the gate line, the first gate insulation portion and the data line are subsequently provided on the base substrate.

14. The display device according to claim 10, wherein the second gate insulation portion has a dielectric constant larger than that of the first gate insulation portion.

15. The display device according to claim 14, wherein the first gate insulation portion has a thickness of 1000 Å~3000 Å, and the second gate insulation portion has a thickness of 1000 Å~3000 Å.

16. A manufacturing method for an array substrate comprising:
forming a gate line, a gate electrode, a gate insulation layer, an active layer, a data line, a source electrode, a drain electrode and a conductive pad on a base substrate, wherein the gate insulation layer includes a first gate insulation portion and a second gate insulation portion;
the gate electrode is located between the first gate insulation portion and the second gate insulation portion, and the second gate insulation portion is located between the gate electrode and the active layer; and
the conductive pad is located at an intersection position between the gate line and the data line, and a first via corresponding to the conductive pad is formed in the gate insulation layer at both sides of the gate line, and the data line is connected to the conductive pad through the first via,
wherein, in a direction perpendicular to the base substrate, the gate line and the data line are disposed in different layers and overlapped with each other, and conductive pad and the source electrode are disposed in different layers, and the first gate insulation portion is located between the gate line and the conductive pad.

17. The manufacturing method for the array substrate according to claim 8, wherein:
a conductive pad metal layer is formed on the base substrate, and after subjected from patterning process, a pattern including the conductive pad is formed;
on the base substrate on which the pattern including the conductive pad has been formed, the first gate insulation portion is formed;
on the base substrate on which the first gate insulation portion has been formed, a gate metal layer is formed, and after subjected from patterning process, a pattern including the gate line and the gate electrode is formed;
on the base substrate on which the pattern including the gate line and the gate electrode has been formed, a second gate insulation film is formed, and after subjected from patterning process, the second gate insulation portion is formed;
on the base substrate on which the second gate insulation portion has been formed, a semiconductor layer is formed, and after subjected from patterning process, a pattern including the active layer is formed;
by performing patterning process, the first via corresponding to the conductive pad is formed in the gate insulation layer at both sides of each of the gate line; and
on the base substrate on which the first via has been formed, a source/drain metal layer is formed, and after subjected from patterning process, a pattern including the data line, the source electrode and the drain electrode is formed, wherein the data line and the gate line are intersected above the conductive pad, and the data line is connected to the conductive pad through the first via.

18. The manufacturing method for the array substrate according to claim 17, wherein:
the first gate insulation portion and the second gate insulation film are formed by deposition, and processing parameters for depositing the second gate insulation film are different from processing parameter for depositing the first gate insulation portion, so that the second gate insulation portion formed after subjected from patterning processing has a dielectric constant larger than that of the first gate insulation portion.

19. The manufacturing method for the array substrate according to claim 16, wherein:
a source/drain metal layer is formed on the base substrate, and after subjected from patterning process, a pattern including the source electrode, the drain electrode and the conductive pad is formed;
on the base substrate on which the pattern including the source electrode, the drain electrode and the conductive pad has been formed, a semiconductor layer is formed, and after subjected from patterning process, a pattern including the active layer is formed;
on the base substrate on which the pattern including the active layer has been formed, a second gate insulation film is formed, and after subjected from patterning process, the second gate insulation portion is formed;
on the base substrate on which the second gate insulation portion has been formed, a gate metal layer is formed, and after subjected from patterning process, a pattern including the gate line and the gate electrode is formed;
on the base substrate on which the pattern including the gate line and the gate electrode has been formed, the first gate insulation portion is formed;
after subjected from patterning process, the first via corresponding to the conductive pad and the second via corresponding to the source electrode are formed in the gate insulation layer; and
on the gate insulation layer in which the first via and the second via have been formed, a data metal layer is formed, and after subjected from patterning process, a pattern including the data line is formed, the data line is connected with the conductive pad through the first via, and connected to the source electrode through the second via.

20. The manufacturing method for the array substrate according to claim 19, wherein:

the first gate insulation portion and the second gate insulation film are formed by deposition, and processing parameters for depositing the second gate insulation film are different from processing parameter for depositing the first gate insulation portion, so that the second gate insulation portion formed after subjected from patterning processing has a dielectric constant larger than that of the first gate insulation portion.

* * * * *